(12) United States Patent
Yeh et al.

(10) Patent No.: US 9,691,555 B2
(45) Date of Patent: Jun. 27, 2017

(54) PHOTOSENSITIVE PORPHYRIN DYES FOR DYE-SENSITIZED SOLAR CELLS

(71) Applicant: NATIONAL CHUNG HSING UNIVERSITY, Taichung (TW)

(72) Inventors: Chen-Yu Yeh, Taichung (TW);
Chi-Lun Mai, Pingtung County (TW);
Bo-Cheng Guo, Chiayi County (TW);
Fang-Yi Ho, Chiayi County (TW);
Chi-Hung Hsieh, New Taipei (TW)

(73) Assignee: NATIONAL CHUNG HSING UNIVERSITY, Taichung (TW)

( * ) Notice: Subject to any disclaimer, the term of this patent is extended or adjusted under 35 U.S.C. 154(b) by 0 days.

(21) Appl. No.: 14/551,867

(22) Filed: Nov. 24, 2014

(65) Prior Publication Data

US 2016/0005546 A1    Jan. 7, 2016

(30) Foreign Application Priority Data

Jul. 1, 2014    (TW) .............................. 103122733 A

(51) Int. Cl.
| | | |
|---|---|---|
| C07D 487/22 | (2006.01) | |
| H01G 9/20 | (2006.01) | |
| C09B 47/00 | (2006.01) | |
| C09B 69/00 | (2006.01) | |
| H01L 51/00 | (2006.01) | |

(52) U.S. Cl.
CPC ........... *H01G 9/2059* (2013.01); *C09B 47/00* (2013.01); *C09B 69/008* (2013.01); *H01L 51/0091* (2013.01); *Y02E 10/542* (2013.01); *Y02E 10/549* (2013.01)

(58) Field of Classification Search
CPC ................................................... C07D 487/22
See application file for complete search history.

(56) References Cited

U.S. PATENT DOCUMENTS

| | | | |
|---|---|---|---|
| 5,648,485 A | 7/1997 | Dolphin et al. | |
| 5,831,088 A | 11/1998 | Dolphin et al. | |
| 2005/0019500 A1 | 1/2005 | Bocian et al. | |
| 2005/0048691 A1 | 3/2005 | Bocian et al. | |
| 2005/0217559 A1 | 10/2005 | Bocian et al. | |
| 2007/0027312 A1 | 2/2007 | Lindsey et al. | |
| 2007/0212897 A1 | 9/2007 | Bocian et al. | |
| 2009/0270638 A1 | 10/2009 | Lindsey et al. | |
| 2010/0125136 A1 | 5/2010 | Yeh et al. | |
| 2012/0302743 A1 | 11/2012 | Vail et al. | |
| 2013/0090469 A1 | 4/2013 | Yeh et al. | |

FOREIGN PATENT DOCUMENTS

| | | |
|---|---|---|
| CN | 103044952 | 5/2005 |
| EP | 0804439 B1 | 9/2003 |
| JP | 2013239312 | 11/2013 |
| JP | 2014165064 | 9/2014 |
| JP | 2014237743 | 12/2014 |
| WO | 2005043583 A2 | 5/2005 |
| WO | WO2015005869 | 1/2015 |

OTHER PUBLICATIONS

Wu et al.Design and characterization of porphyrin sensitizers with a push-pull framework for highly efficient dye-sensitized solar cells. Energy & Environmental Science (2010), 3(7), 949-955.*
Enveloping porphyrins for efficient dye-sensitized solar cells. Wang et al. Energy and Environmental Science, 2012, 5, 6933.*
Si et al. 8-Hydroxylquinoline-conjugated porphyrins as broadband light absorbers for dye-sensitized solar cells. New J. Chem., 2014,38, 1565-1572.*
Aaron Bullous,MChem, Development of Porphyrin-Antiangiogenic Antibody Immunoconjugates for Photodynamic Therapy, Dec. 2010, p. 5,54,65,98,102.
Cheng-Hua Wu, et al., Porphyrins for efficient dye-sensitized solar cells covering the near-IR region, Journal of Materials Chemistry A, 2014, vol. 2, No. 4, pp. 991-999.
Takeru Bessho, et al., Highly Efficient Mesoscopic Dye-Sensitized Solar Cells Based on Donor-Acceptor-Substituted Porphyrins, Angew. Chem. Int. Ed., 2010, vol. 49, pp. 6646-6649.
Jie Luo, et al., N-Annulated Perylene as An Efficient Electron Donor for Porphyrin-Based Dyes: Enhanced Light-Ability and High-Efficiency Co(II/III)-Based Dye-Sensitized Solar Cells, Journal of the American Chemical Society, 2014, vol. 136, pp. 265-272.
Chou-Pou Hsieh, et al., Synthesis and characterization of porphyrin sensitizers with various electron-donating substituents for highly efficient dye-sensitized solar cells, Journal of Materials Chemistry, 2010, vol. 20, pp. 1127-1134.

(Continued)

*Primary Examiner* — Brian McDowell
(74) *Attorney, Agent, or Firm* — WPAT, PC

(57) ABSTRACT

A photosensitive porphyrin-based dye is adapted to be used in a photoelectric converting device such as a dye-sensitized solar cell. The photosensitive porphyrin-based dye has a porphyrin center, at least one electron donor unit, at least one electron acceptor unit and an optional blocker unit wherein the units are directly connected to the porphyrin center or connected to the porphyrin center via ethynyl-bridges. The photosensitive porphyrin-based dye having a structural formula (I):

(I)

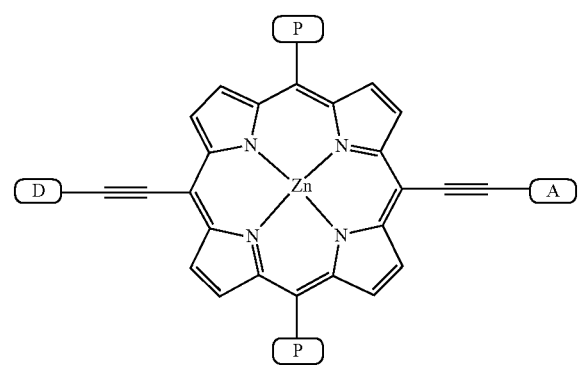

where D represents an electron donor unit, A represents an electron acceptor unit and P represents a blocker unit.

3 Claims, No Drawings

(56) References Cited

OTHER PUBLICATIONS

Teresa Ripolles-Sanchis, et al., Design and characterization of alkoxy-wrapped push-pull porphyrins for dye-sensitized solar cells, Chemical Communication, 2012, vol. 48, pp. 4368-4370.

Jianfeng Lu et al: "A cyclopenta [1,2-b:5,4-b' ] dithiophene-porphyrin conjugate for mesoscopic solar cells: a D-[pi]-D-A approach", Physical Chemistry Chemical Physics., vol. 16, No. 45, 2014 , pp. 24755-24762.

Huifang Zhao et al: "2-Ethynyl-6-methylthieno [3,2-b] thiophene as an efficient [pi] spacer for porphyrin-based tees", Dyes and Pigments., vol. 122, 2015 , pp. 168-176.

European Patent Office "Partial European Search Report", issued on Dec. 16, 2015, Munich, Germany.

Japan Patent Office "Search Report", issued on Jun. 7, 2016, Japan.

Sung-Lin Wu et al., Design and characterization of porphyrin sensitizers with a push-pull framework for highly efficient dye-sensitized solar cells, Energy & Environmental Science, 2010, vol. 3, pp. 949-955.

Chin-Li Wang et al., Enveloping porphyrins for efficient dye-sensitized solar cells, Energy & Environmental Science, 2012, vol. 5, pp. 6933-6940.

* cited by examiner

PHOTOSENSITIVE PORPHYRIN DYES FOR DYE-SENSITIZED SOLAR CELLS

FIELD OF THE INVENTION

The present invention relates to a photosensitive porphyrin-based dye, and more particularly to a photosensitive porphyrin-based dye for a photoelectric converting device. The present invention also relates to a dye-sensitized solar cell.

BACKGROUND OF THE INVENTION

Recently, with increasing awareness of environmental protection, the demand on renewable energy is growing. Among various renewable energy sources, solar energy is expected to replace fossil fuel as a new energy source because it provides clean energy without depletion. The solar energy may be converted into electric energy without generating contaminants. In other words, the solar energy source is the most viable renewable energy source.

Generally, a solar cell is used to convert solar energy into electric energy. The conventional solar cell is made of semiconducting materials. In particular, silicon-based solar cell is the mainstream in the market. The photoelectric conversion efficiency and the cost-effectiveness of the solar cell are gradually improved. However, the photoelectric conversion efficiency and the cost-effectiveness of the conventional solar cell are still unsatisfied so far. Consequently, many academic institutions and manufacturers devote much effort in improving the original solar cell configurations and looking for novel solar cell configurations in order to increase the performance and reduce the fabricating cost. For example, a dye-sensitized solar cell (DSSC) is one of the candidate solar cells because the fabricating cost of the dye-sensitized solar cell is as low as one tens to one fifth of the fabricating cost of the conventional silicon-based solar cell. Moreover, since it is not necessary to produce the dye-sensitized solar cell under high-temperature vacuum environment, the production conditions of the dye-sensitized solar cell are less stringent than the conventional silicon-based solar cell.

The dye-sensitized solar cell is a photoelectrochemical system that uses the photoexcitation of a dye-based photosensitizer to generate photocurrent resulting from a chemical reaction. Generally, the dye-sensitized solar cell includes a substrate, a transparent conductive film, a semiconductor film, a dye, an electrolyte and a counter electrode. The working principles will be illustrated as follows. Firstly, a titanium dioxide or zinc oxide semiconductor film is coated with a special light-absorbing dye. When the dye is irradiated by sunlight, electrons of the dye are excited from a ground state to an excited state. The excited electrons may be injected into the conduction band of the semiconductor film so as to become free electrons. These free electrons may flow out through conductive glass or conductive plastic (conductive polymer), which is connected with the semiconductor film. Consequently, a current is generated. The electrolyte is located at the other side of the dye. The dye molecules that lose the electrons may receive electrons from the electrolyte so as to be restored to its original state. Then, the electrons flowing from the dye pass through a load and reach a platinum electrode, which contacts with the electrolyte. Consequently, the electrolyte receives these free electrons, and a complete loop is created. In the dye-sensitized solar cell, the coating manner of the photosensitive dye and the structure of the photosensitive dye may influence the photoelectric conversion efficiency and the stability of the dye-sensitized solar cell. Moreover, the selection of the photosensitive dye is highly related to the cost of the dye-sensitized solar cell and even related to the development potential of the solar cell.

Organic photosensitive dyes have been emphasized in development of solar cells for their high absorption coefficient, facile modification and adjustable photophysical properties. The inventor has described a photosensitive porphyrin-based dye in US 2010/0125136 A1. Porphyrin is viewed as artificial chlorophyll. Chlorophyll is a green pigment found in plants and allows plants to absorb light to initiate photosynthesis, i.e. producing oxygen and carbohydrates from carbon dioxide and water. The porphyrin plays a similar role in the dye-sensitized solar cells, e.g. converting energy of visible light and near-infrared light into electric energy. The advantages of using the porphyrin molecules in the dye-sensitized solar cells include appropriate energy level of the excited electrons to the utilization of titanium dioxide, wide absorption range of sunlight, and longer lifetime of the excited electrons. However, the conventional solar cells using the porphyrin do not gain satisfied benefit. It is found that the porphyrin molecules are easily aggregated to affect the photoelectric conversion efficiency.

Therefore, novel photosensitive porphyrin-based dyes are developed in the present disclosure to improve properties of the photosensitive dyes for a photoelectric converting device such as a dye-sensitized solar cell. The balance between the photoelectric conversion efficiency, the stability of the solar cell, the ease of synthesis and the cost effectiveness may increase the commercial competition of the dye-sensitized solar cell.

SUMMARY OF THE INVENTION

A photosensitive porphyrin-based dye for a photoelectric converting device such as a dye-sensitized solar cell is provided. The photosensitive porphyrin-based dye has a structural formula of:

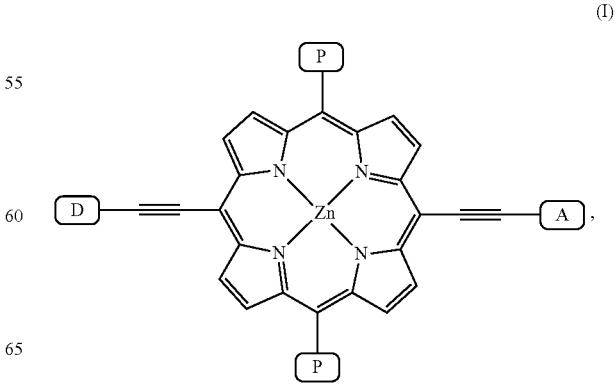

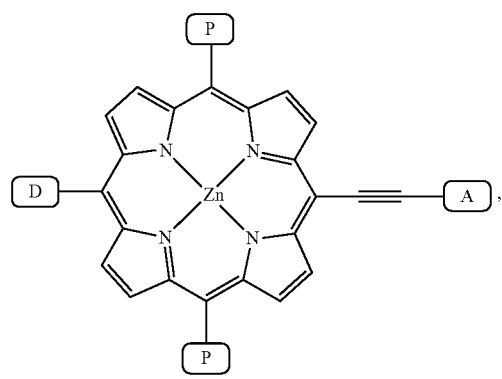 (II)
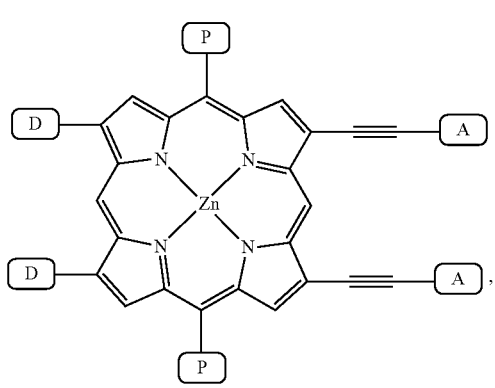 (VI)
(III)
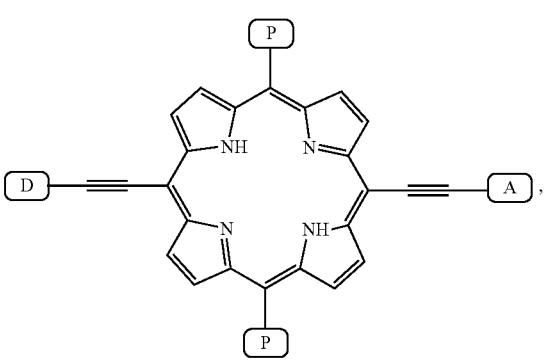 (VII)
(IV)
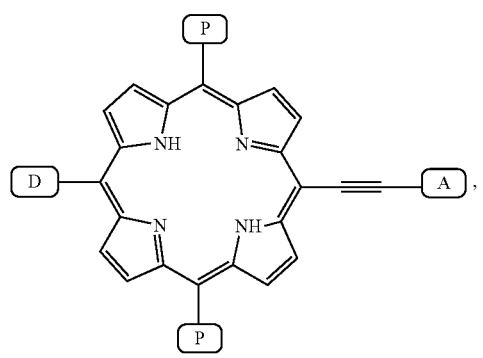 (VIII)
(V)
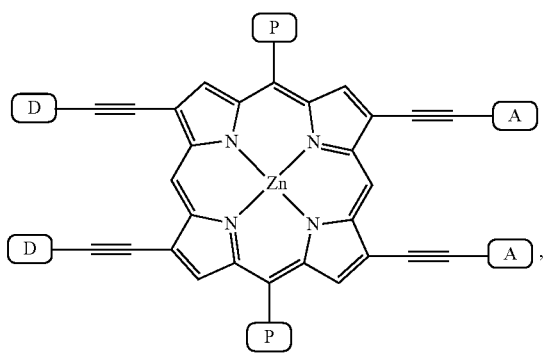 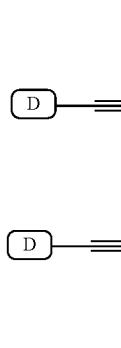 (IX)

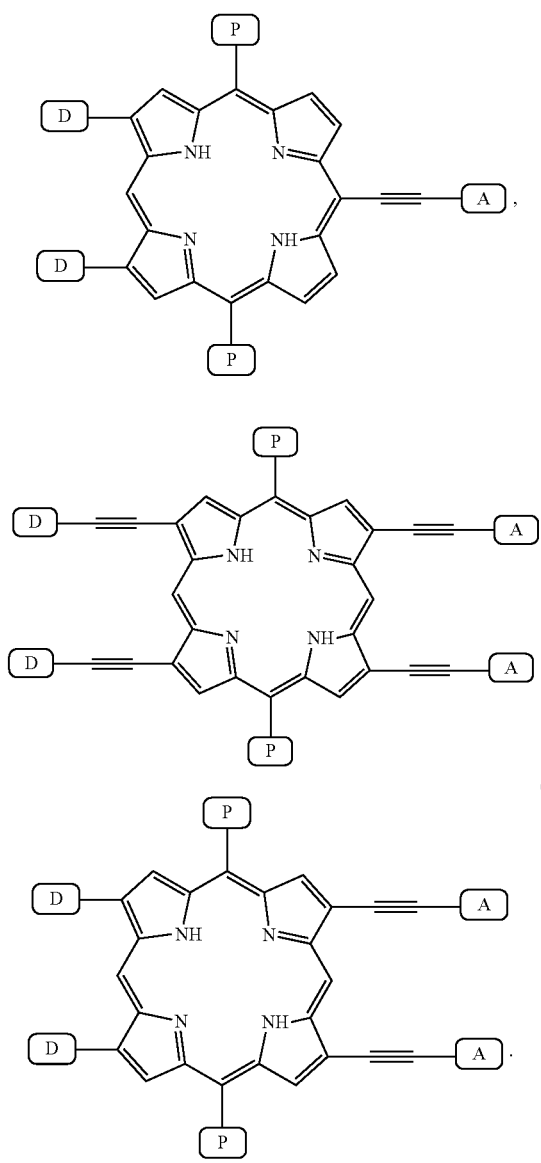
D represents an electron donor unit having a structural formula of:
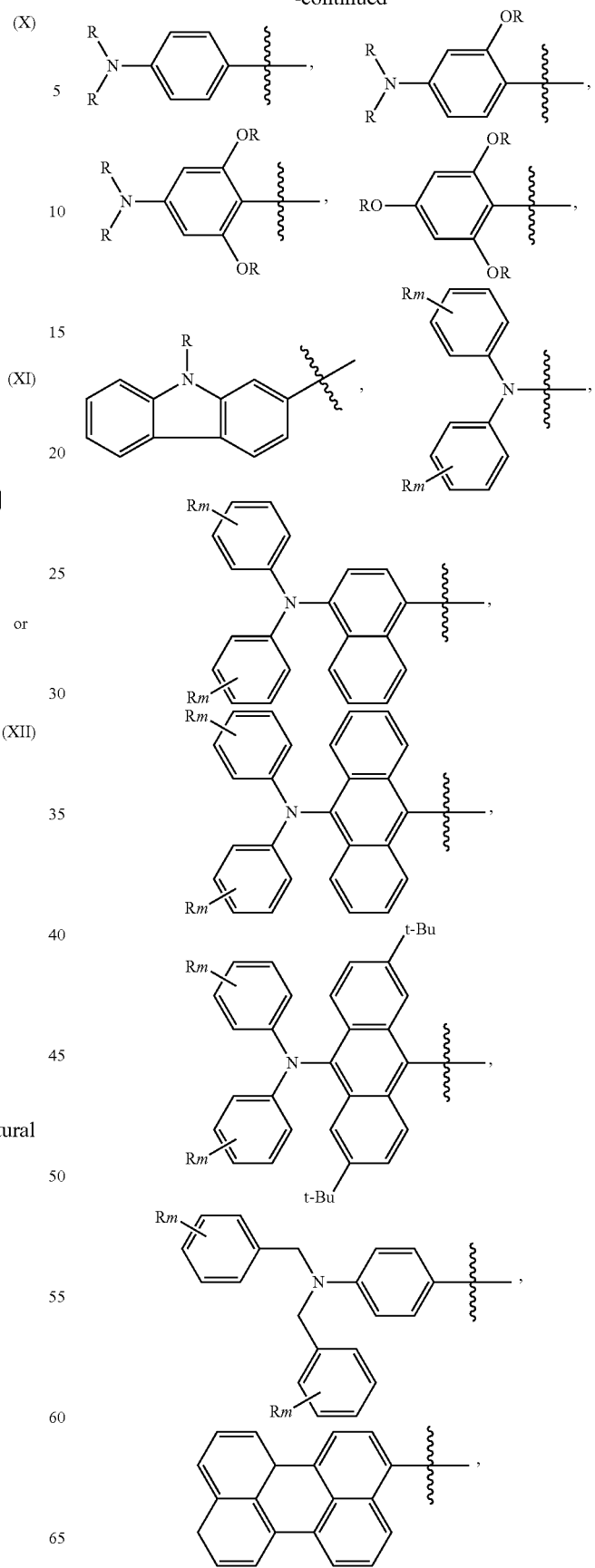

-continued
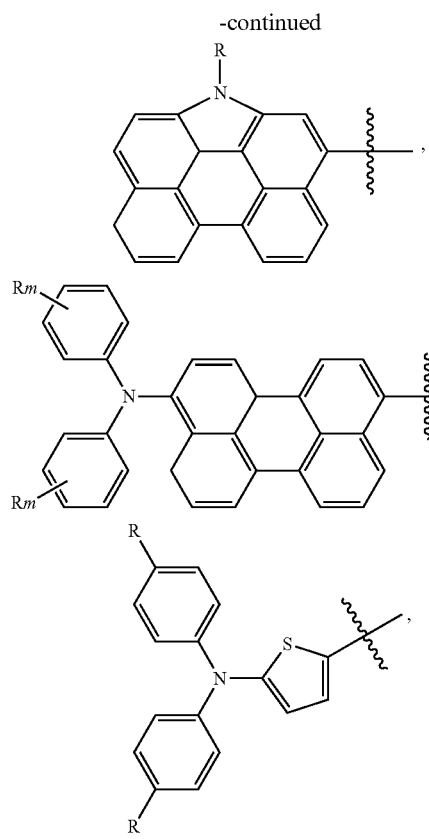
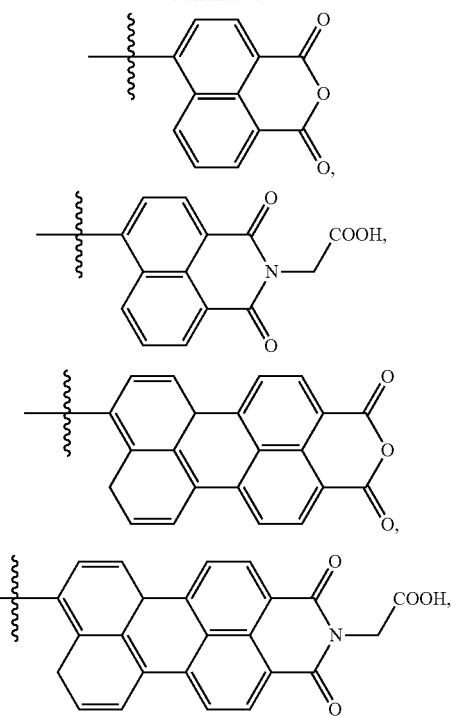
wherein R=$C_nH_{2n+1}$ or $OC_nH_{2n+1}$, n=0 to 12 and m=0 to 5. Two electron donor units D in the same structural formula are identical or different. A represents an electron acceptor unit having a structural formula of:
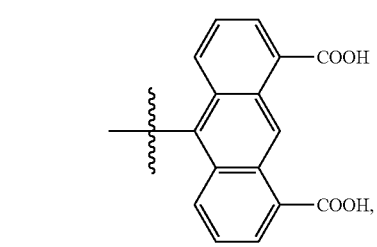
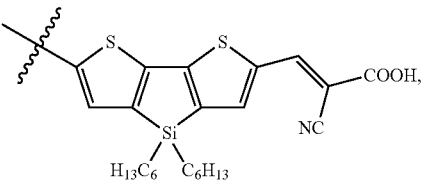
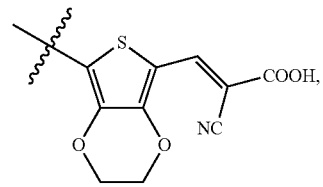
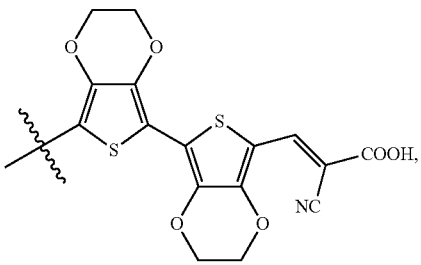

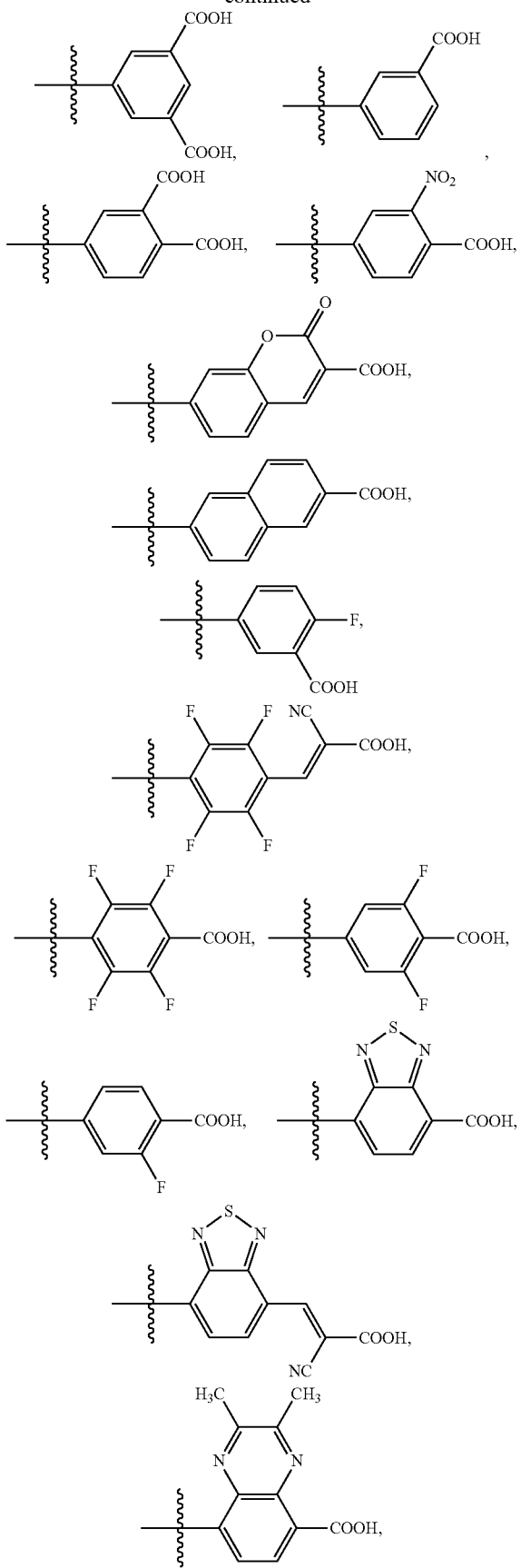
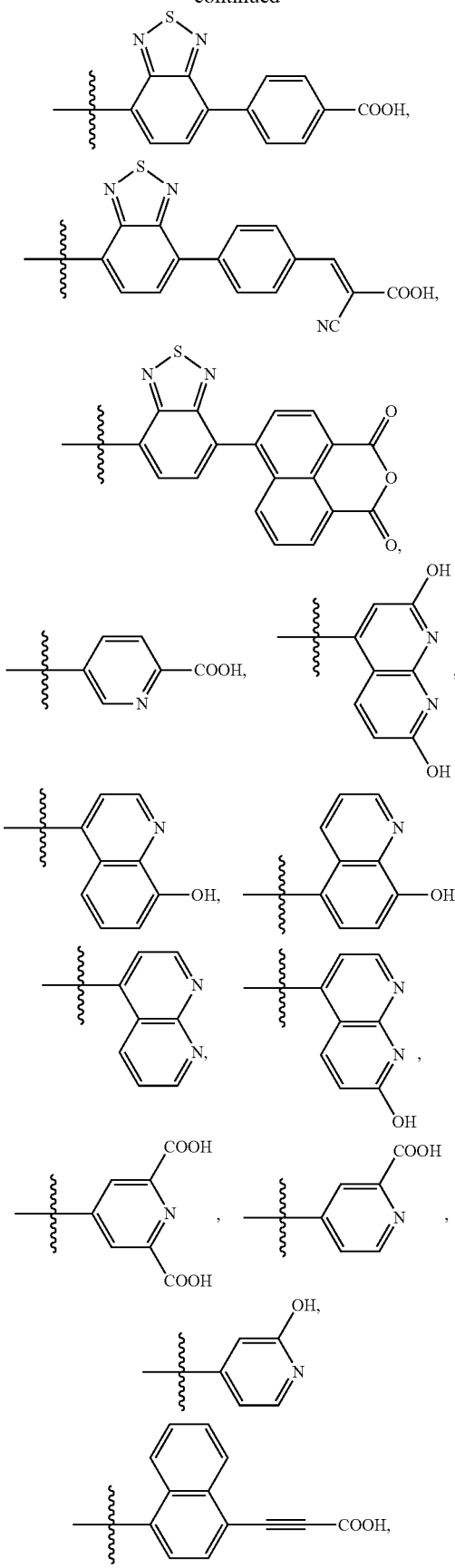

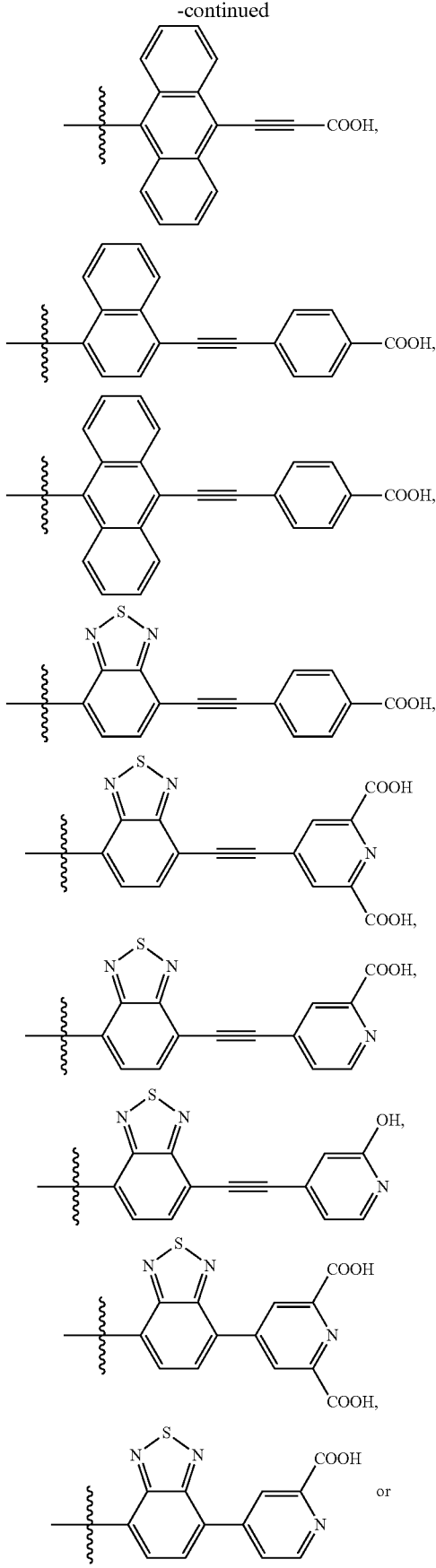
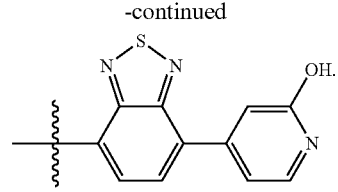
Two electron acceptor units A in the same structural formula are identical or different. P represents an optional blocker unit having a structural formula of:
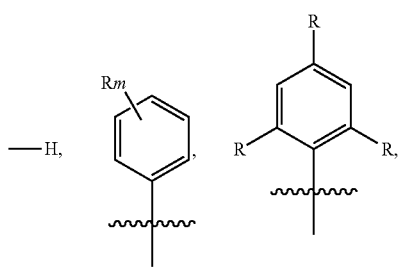
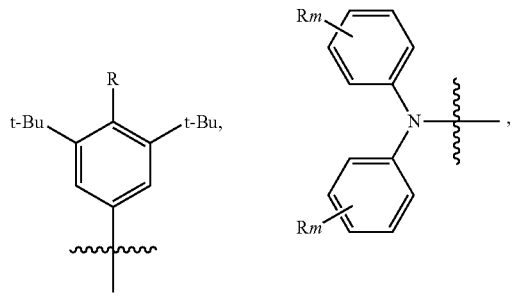
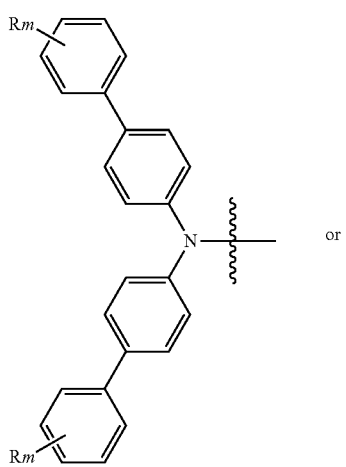
or -continued

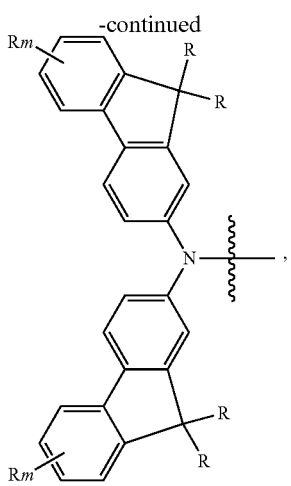

wherein R=$C_nH_{2n+1}$, $C_nH_2F_{2n-1}$, $OC_nH_{2n+1}$ or $OC_nH_2F_{2n-1}$, n=0 to 12 and m=0 to 5. Two blocker units P in the same structural formula are identical or different.

In an embodiment, the electron donor unit D has a structural formula of:

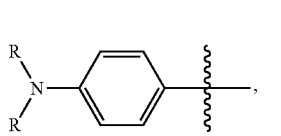 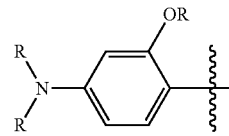

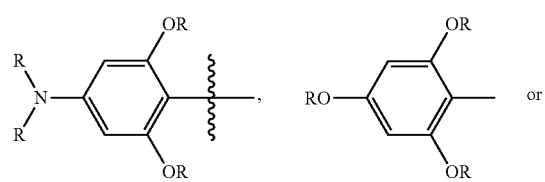

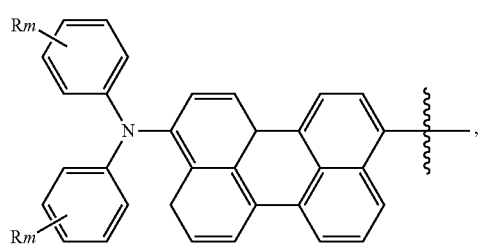

wherein R=$C_nH_{2n+1}$ or $OC_nH_{2n+1}$, n=0 to 12 and m=0 to 5.

In an embodiment, the electron acceptor unit A has a structural formula of:

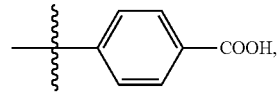

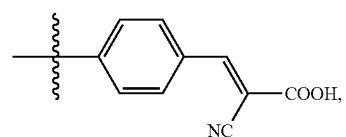

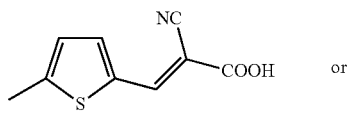

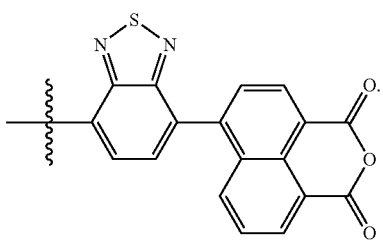

In an embodiment, the blocker unit P is

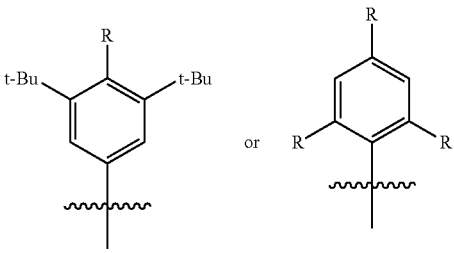

wherein R=$C_nH_{2n+1}$, $C_nH_2F_{2n-1}$, $OC_nH_{2n+1}$ or $OC_nH_2F_{2n-1}$, n=0 to 12.

A photosensitive porphyrin-based dye for a photoelectric converting device such as a dye-sensitized solar cell is provided. The photosensitive porphyrin-based dye is 5-(4-carboxyphenylethynyl)-15-(4-(N,N-dioctylamino) phenylethynyl)-10,20-bis(3,5-di-tert-butyl-4-methoxyphenyl) porphyrinato Zinc(II) having a structural formula of:

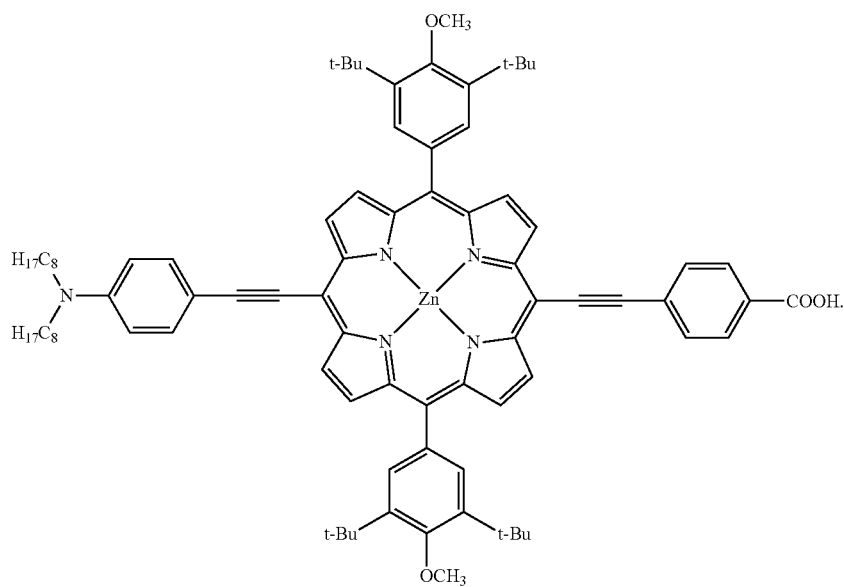

A dye-sensitized solar cell containing the above-mentioned photosensitive porphyrin-based dye is provided. The photosensitive porphyrin-based dye is coated on a semiconductor film and used as a photosensitizer.

DETAILED DESCRIPTION OF THE PREFERRED EMBODIMENT

The present disclosure will now be described more specifically with reference to the following embodiments. It is to be noted that the following descriptions of embodiments of this invention are presented herein for purpose of illustration and description only. It is not intended to be exhaustive or to be limited to the precise form disclosed.

The present disclosure provides a photosensitive porphyrin-based dye suitable for any photoelectric converting device (e.g. a dye-sensitized solar cell) which takes advantages of photosensitivity of dyes to assist in photoelectric conversion. To enhance the photoelectric conversion efficiency of the dye-sensitized solar cell, it is not enough that electrons of the photosensitive dye can be excited by sunlight. In addition, the energy level of the electrons in the excited state should match the energy level of the material of the semiconductor film (e.g. titanium dioxide). Consequently, the excited electrons can be transferred to the semiconductor film to generate the current. Moreover, for increasing the photoelectric conversion efficiency, the absorption range in the absorption spectrum of the photosensitive dye should be as wide as possible in order to absorb more solar energy.

For meeting the above demands, the present disclosure provides a novel photosensitive porphyrin-based dye which is coated on the semiconductor film and used as a photo sensitizer. These series of photosensitive porphyrin-based dyes are ethynyl-bridged porphyrin dyes having one of the following structural formulae (I)~(XII) in which a porphyrin center have four modified pyrrole subunits interconnected via methine bridges (=CH—):

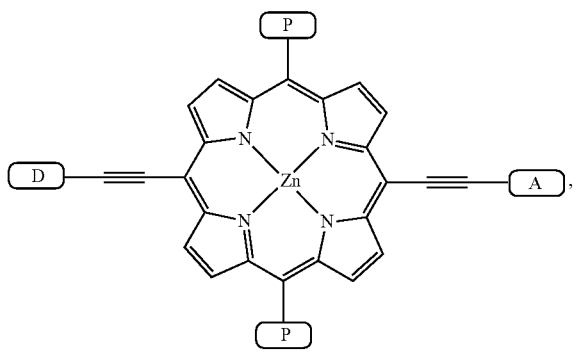

(I)

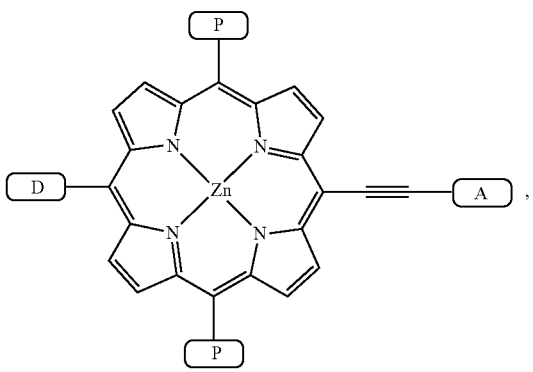

(II)

(III)
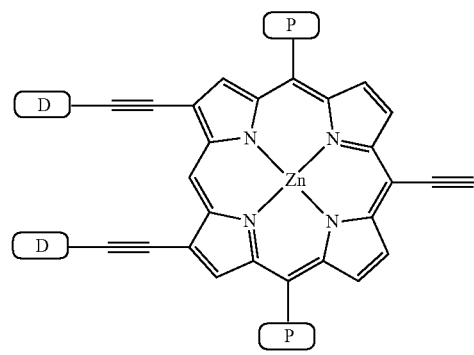
(IV)
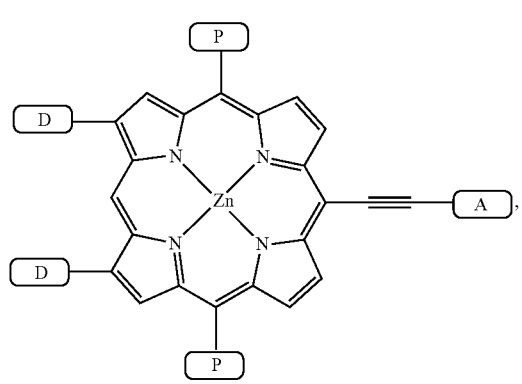
(V)
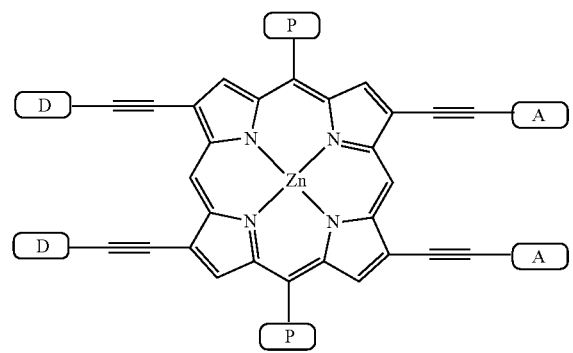
(VI)
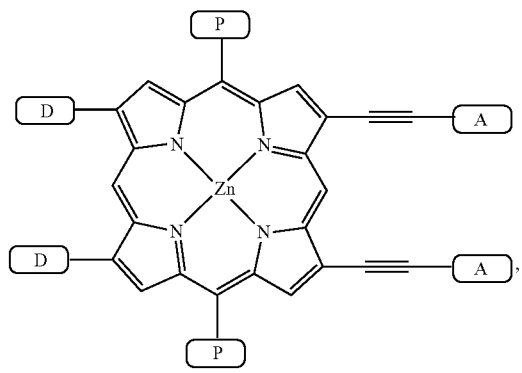
(VII)
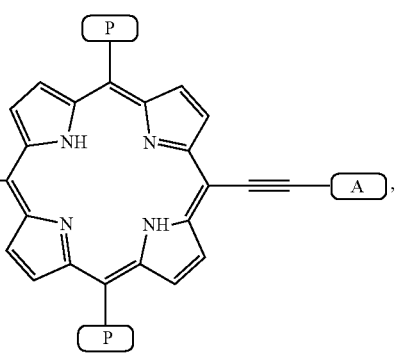
(VIII)
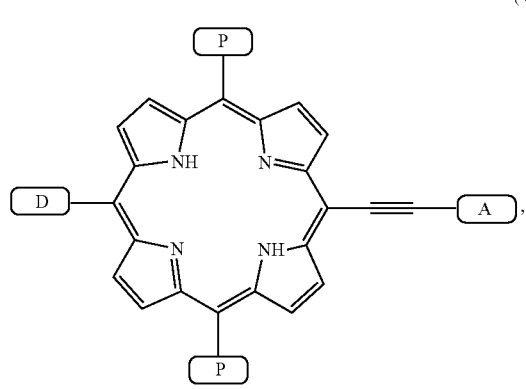
(IX)
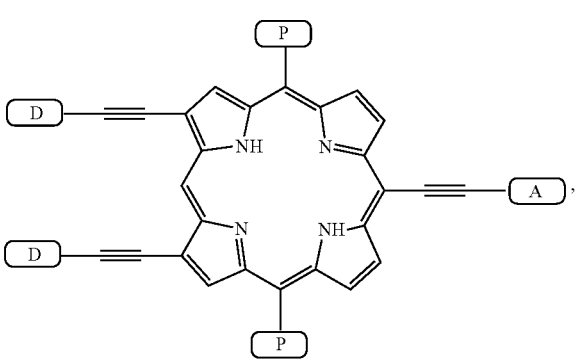
(X)
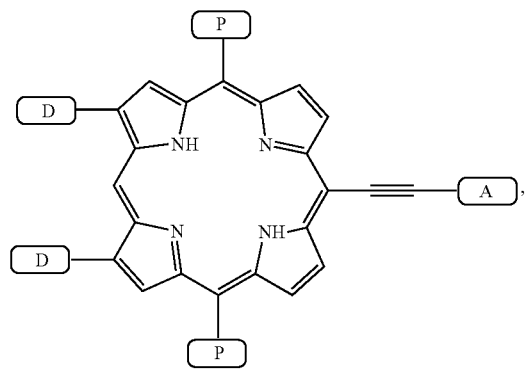

-continued

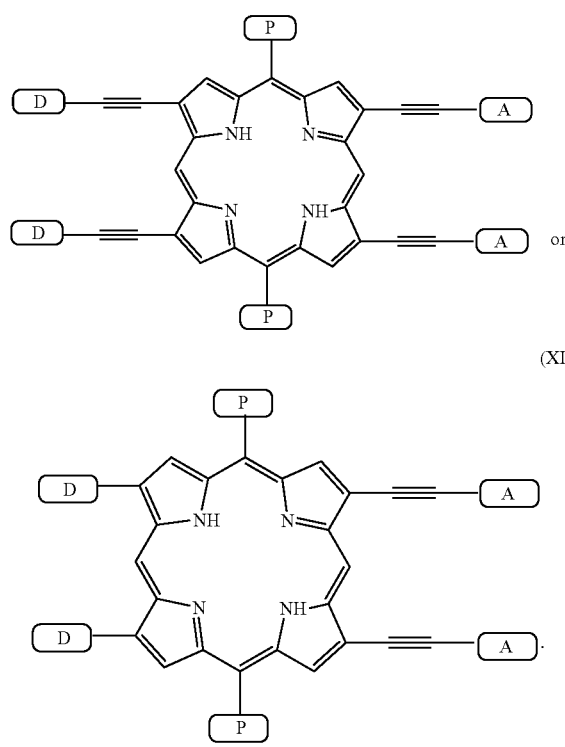
(XI)

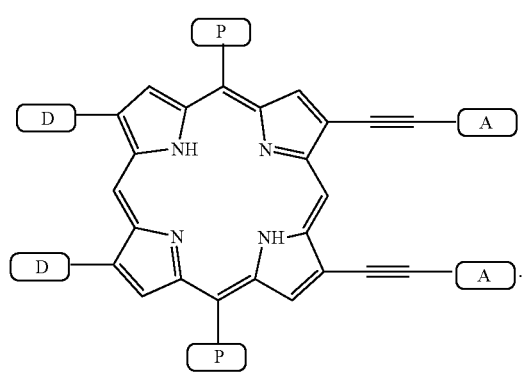
(XII) or

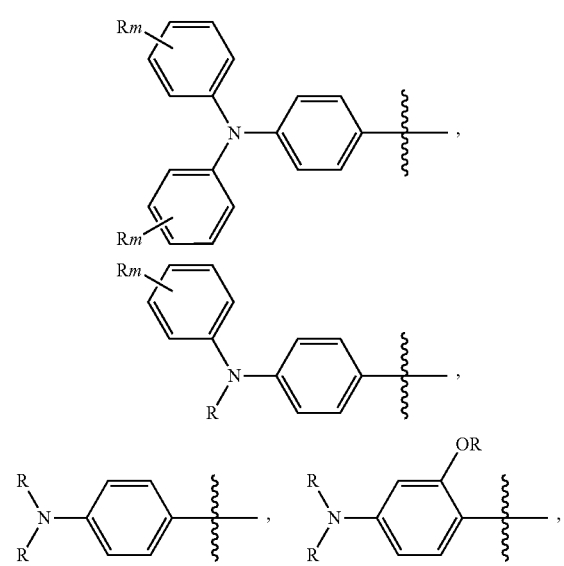
.

D represents an electron donor unit, A represents an electron acceptor unit, and P represents a blocker unit. In one of the structural formulae, if there are two electron donor units D, two electron acceptor units A or two blocker units P, the two units of the same kind can be identical or different.

The structure of each of the units D, A and P are described in detail in the following description.

The electron donor unit D includes an electron-donating group having a structural formula of:

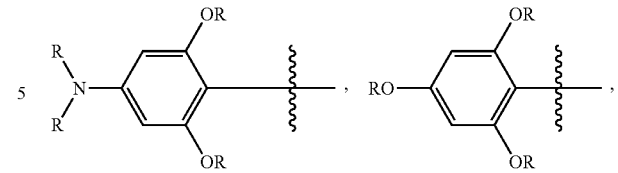

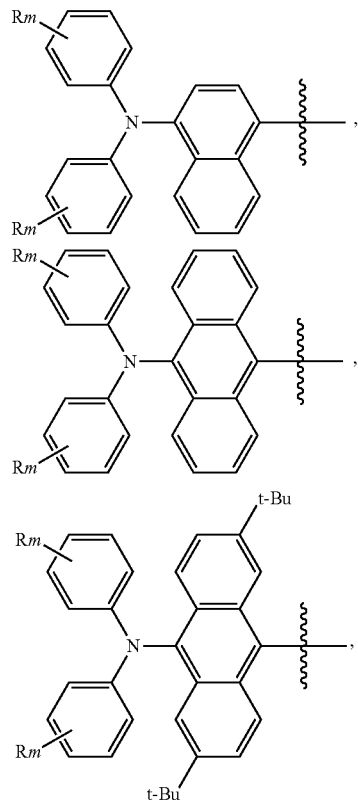

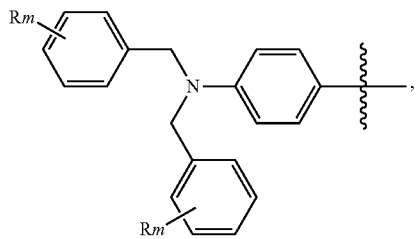

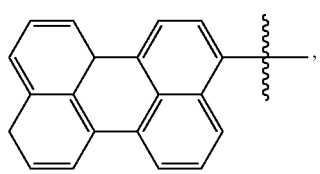

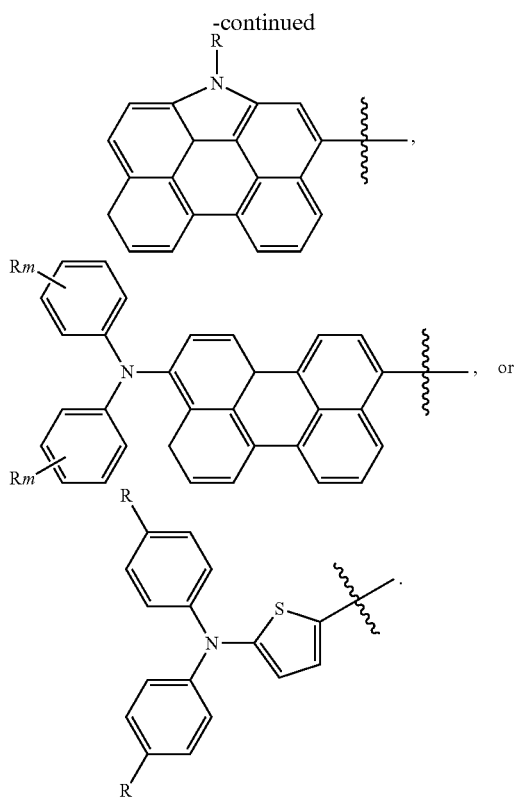

In an preferred embodiment, the electron-donating group of the electron donor unit D has a structural formula of:

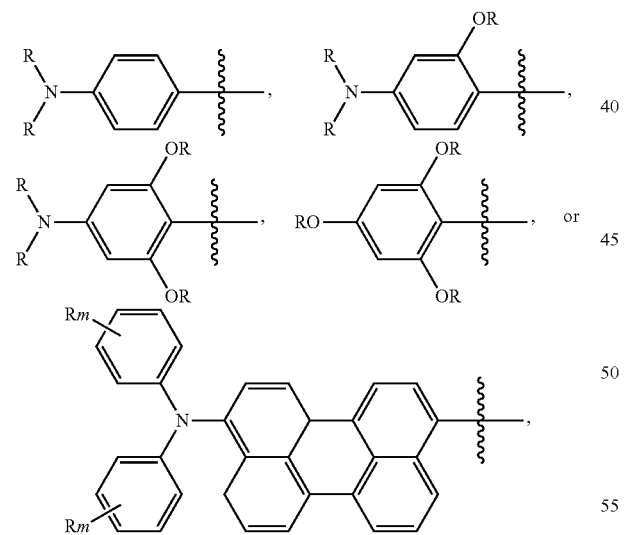

wherein $R=C_nH_{2n+1}$ or $OC_nH_{2n+1}$, n=0 to 12 and m=0 to 5.

The electron acceptor unit A includes an electron-withdrawing group. The electron-donating group of the electron donor unit D and the electron-withdrawing group of the electron acceptor unit A form a push-pull configuration so as to improve the photosensitive porphyrin-based dye to overcome the aggregation problem. The electron-withdrawing group of the electron acceptor unit A has a structural formula of:

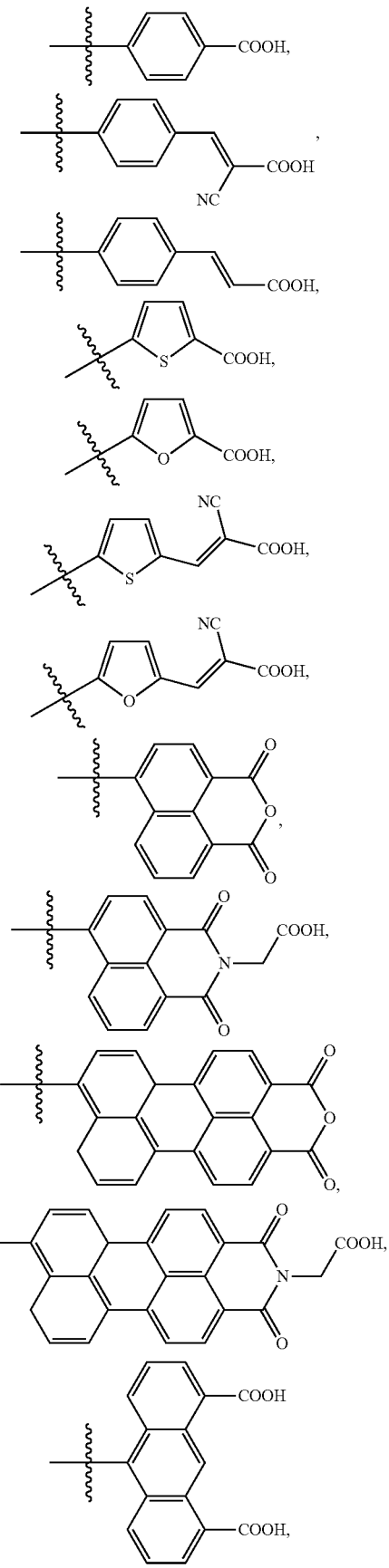

23
-continued
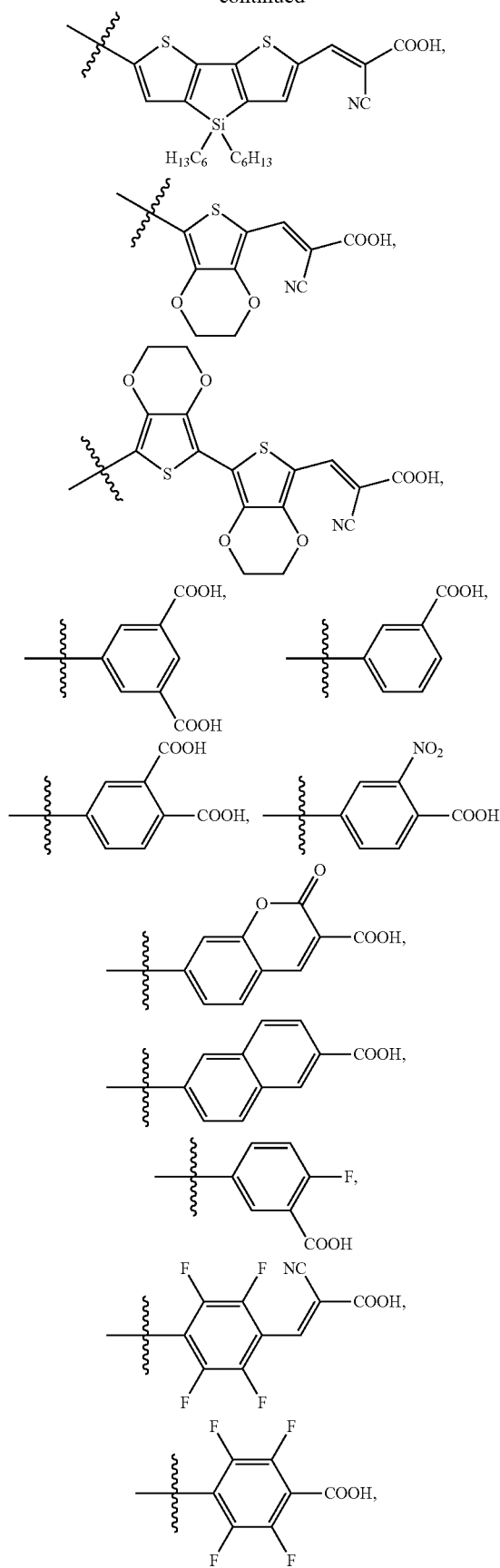
24
-continued
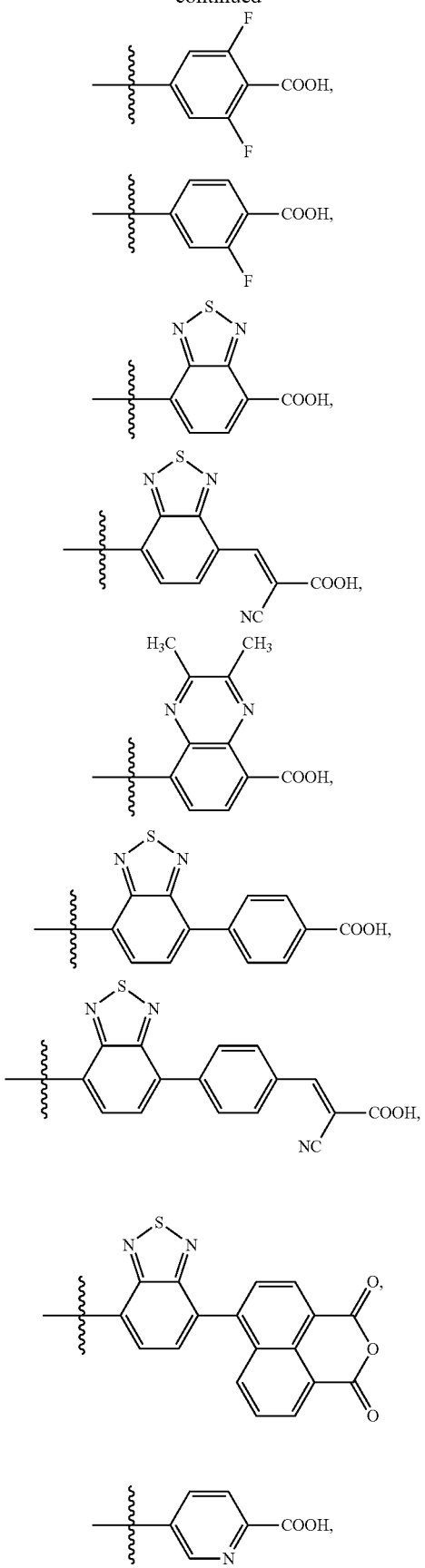

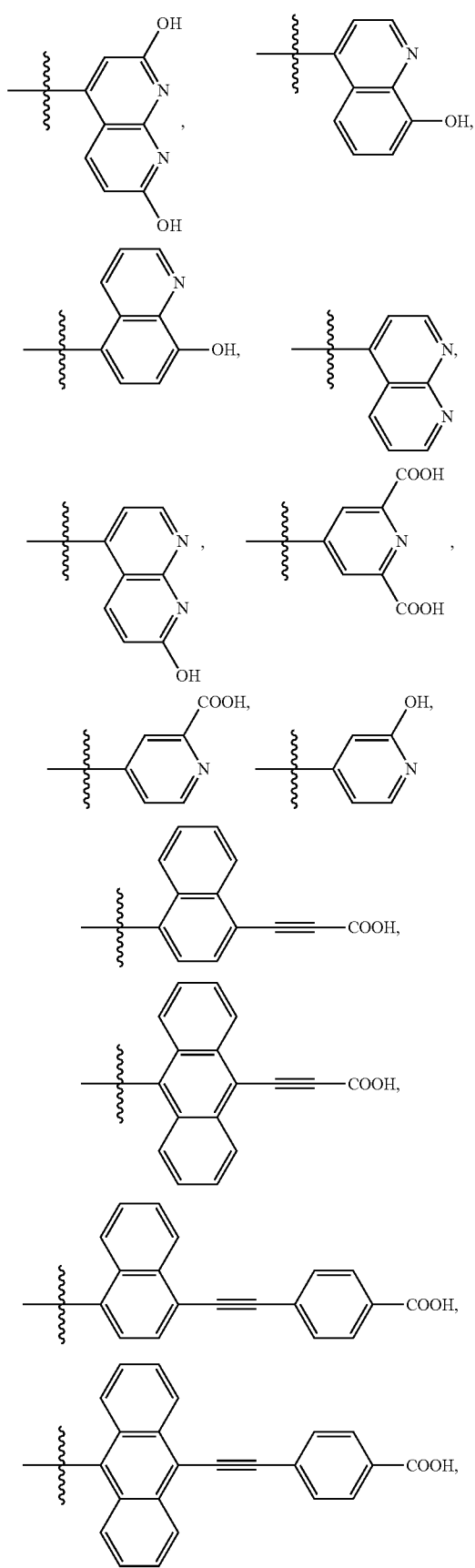
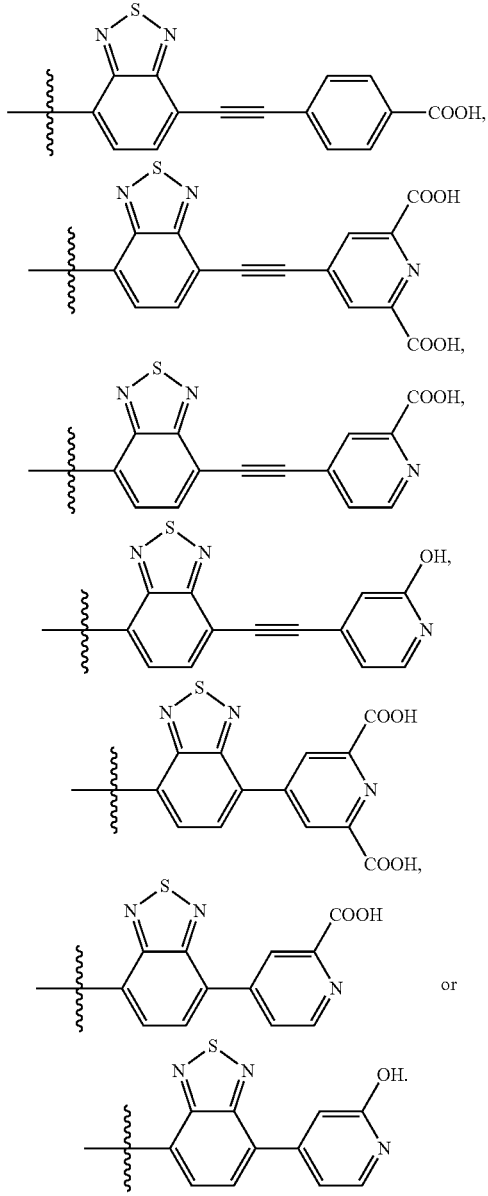
In an preferred embodiment, the electron-withdrawing group of the electron acceptor unit A has a structural formula of:
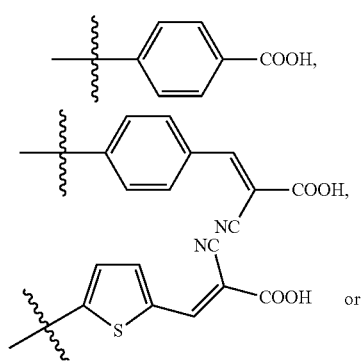

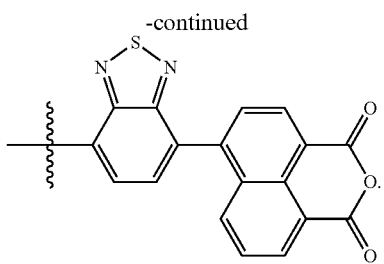

The blocker unit P is used to space out prophyrin molecules of the porphyrin-based dye to avoid aggregation of the prophyrin molecules. The blocker unit P further stops the electrolyte from getting close to the titanium dioxide semiconductor film resulting in recombination of the positive charges and the negative charges. Therefore, the photoelectric conversion efficiency of the solar cell can be improved. The blocker unit P may include, but is not limited to, an aryl group, especially an aryl group having a long carbon chain. In practice, since several units (e.g. electron donor unit D or electron acceptor unit A) of the photosensitive porphyrin-based dye may reduce the aggregation phenomenon due to various substitutes, the blocker unit P can be omitted (i.e. the blocker unit P is considered as a hydrogen atom —H) or a simple group such as a substituted or un substituted phenyl group or alkyl group. If the blocker unit P is necessary, it is selected from one of the following blocker units:

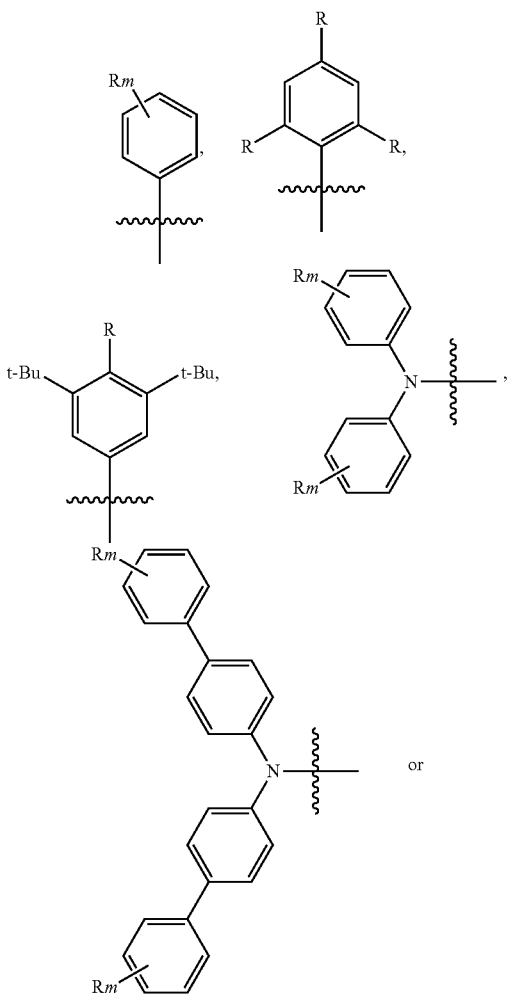

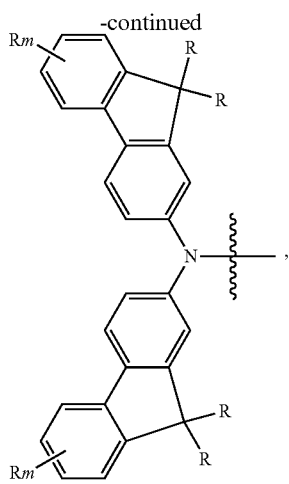

where $R=C_nH_{2n+1}$, $C_nH_2F_{2n-1}$, $OC_nH_{2n+1}$ or $OC_nH_2F_{2n-1}$, n=0 to 12 and m=0 to 5. The two blocker units P in the same structural formulae may be different or identical blocker units P.

In a preferred embodiment, the blocker unit P, if any, has a structural formula of:

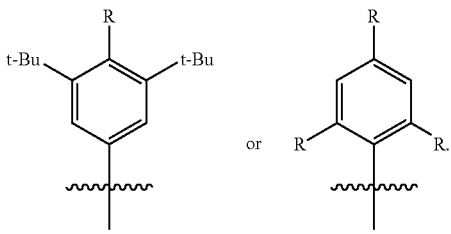

The electron-donating group of the electron donor unit D and the electron-withdrawing group of the electron acceptor unit A form a push-pull configuration which can improve the performance of the photosensitive porphyrin-based dye. Furthermore, if the electron acceptor unit A and the electron donor unit D are bulky functional groups, the absorption range in the absorption spectrum of the photosensitive porphyrin-based dye is widened so as to increase sunlight absorption efficiency. It is to be noted that the balance between the cost, the production process, the photoelectric conversion efficiency, the stability of the solar cell or other factors should be taken into consideration to maintain competitiveness while the photosensitive porphyrin-based dye is applied to the solar cells.

In the compound, each of the electron donor unit(s) D, the electron acceptor unit(s) A and the optional blocker unit(s) P directly connected to the porphyrin center or connected to the porphyrin center via the ethynyl-bridge(s) may be selected to meet different requirements. For example, a bulky electron donor unit D and a bulky electron acceptor unit A results in a greater adsorption range; the electron acceptor unit A with a bifunctional group (e.g. dihydroxyl, dicarboxyl or diketone) can strengthen combination between the photosensitive porphyrin-based dye and the semiconductor film (e.g. a titanium dioxide semiconductor film); or simpler units A, D or P can lower production cost and synthesis difficulty. In consideration of the photoelectric conversion efficiency, the synthesis difficulty and the cost, a preferred example of the photosensitive porphyrin-based dye is 5-(4-carboxyphenylethynyl)-15-(4-(N,N-dioctylamino) phenylethynyl)-10,20-bis(3,5-di-tert-butyl-4-methoxyphenyl) porphyrinato Zinc(II), which is represented by the following structural formula:

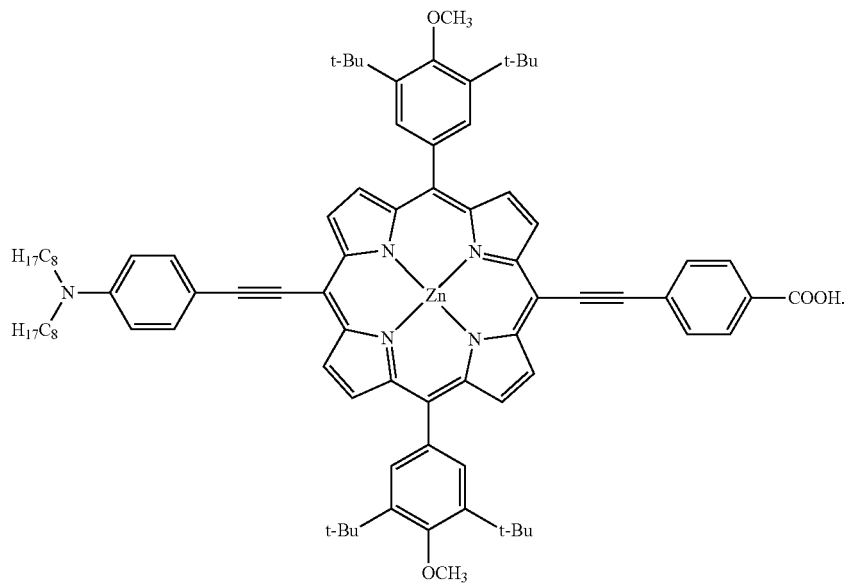

A synthesis of the photosensitive porphyrin-based dye is given herein for illustration purpose only. The provided synthesis shows that the photosensitive porphyrin-based dye has advantage of easy production process. However, it is to be noted that the photosensitive porphyrin-based dye of the present disclosure may be synthesized by any other appropriate method.

3,5-di-tert-butyl-4-methoxybenzaldehyde (1)

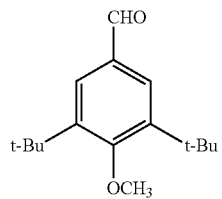 [SMILES: COc1c(C(C)(C)C)cc(C=O)cc1C(C)(C)C]

At first, sodium hydride (NaH, 1.27 g, 53 mmol) is added slowly into a solution of 3,5-di-tert-butyl-4-hydroxybenzaldehyde (5 g, 21 mmol) dissolved in dry tetrahydrofuran (THF, 22.5 ml) at 0° C. under nitrogen. The mixture is removed from the cooling bath and the reaction proceeds for 30 min. Then, processes including adding methyl iodide (CH₃I, 5.2 ml, 84 mmol) dissolved in dry THF (9 ml) in the mixture, refluxing for 12 hr, quenching with methanol (MeOH) in the cooling bath, extracting with dichloromethane (CH$_2$Cl$_2$), concentrating, purifying by a column chromatography method (using ethyl acetate:hexane=1:7 as eluent) are sequentially performed. A yellow liquid product (1) is obtained (4.5 g, 87%). $^1$H NMR (CDCl$_3$, 400 MHz) δ 9.91 (s, 1H), 7.79 (s, 2H), 3.73 (s, 3H), 1.46 (s, 18H).

N,N-dioctyl-4-iodobenzenamine (2)

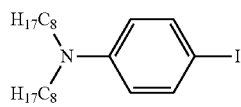

A mixture of 4-iodoaniline (1 g, 4.6 mmol) and potassium carbonate (K$_2$CO$_3$, 1.89 g, 13.7 mmol) is dissolved in dimethylformamide (DMF, 3 ml) under nitrogen, and then 1-bromooctane (2.43 ml, 13.8 mmol) is added. Processes including refluxing for 24 hr, concentrating, extracting with CH$_2$Cl$_2$ for three times, drying with anhydrous magnesium sulfate (MgSO$_4$), concentrating, purifying by a column chromatography method using hexane as eluent are sequentially performed. A light yellow liquid product (2) is obtained (1.33 g, 65%). $^1$H NMR (400 MHz, CDCl$_3$) δ 7.40 (d, J=8.8 Hz, 2H), 6.40 (d, J=8.8 Hz, 2H), 3.23-3.15 (m, 4H), 1.54 (d, J=6.9 Hz, 4H), 1.28 (d, J=6.4 Hz, 20H), 0.88 (t, J=6.7 Hz, 6H).

5,15-bis(3,5-di-tert-butyl-4-methoxyphenyl) porphyrin (3)

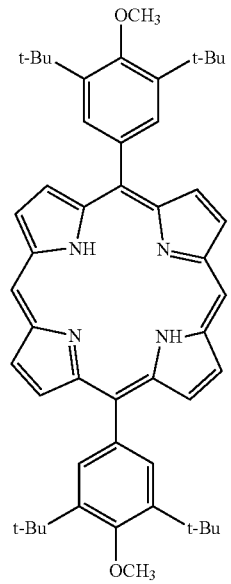 [SMILES: COc1c(C(C)(C)C)cc(-c2c3nc(cc4ccc([nH]4)c(-c4cc(C(C)(C)C)c(OC)c(C(C)(C)C)c4)c4nc(cc5ccc2[nH]5)C=C4)C=C3)cc1C(C)(C)C]

Dipyrromethane (1.75 g, 12 mmol) and product (1) (3 g, 12 mmol) is dissolved in CH$_2$Cl$_2$ (2 L) and degassed with nitrogen for 30 min under light-shielded conditions. Trifluoroacetic acid (TFA, 0.64 ml, 8.4 mmol) is added slowly into the mixture and the reaction proceeds for 3.5 hr. Then, 2,3-dichloro-5,6-dicyano-1,4-benzoquinone (DDQ, 4.09 g, 18 mmol) is added to and the reaction proceeds for 2 hr. Processes including quenching with triethylamine (NEt$_3$), concentrating, purifying by a column chromatography method using CH$_2$Cl$_2$ as eluent and recrystallization with CH$_2$Cl$_2$/MeOH are sequentially performed. A purple solid product (3) is obtained (2.69 g, 30%). $^1$H NMR (CDCl$_3$, 400 MHz) δ 10.32 (s, 2H), 9.42 (d, J=4.8 Hz, 4H), 9.16 (d, J=4.4 Hz, 4H), 8.19 (s, 4H), 4.04 (s, 6H), 1.67 (s, 36H), −3.00 (s, 2H).

5,15-bis(3,5-di-tert-butyl-4-methoxyphenyl) porphyrinato Zinc(II) (4)

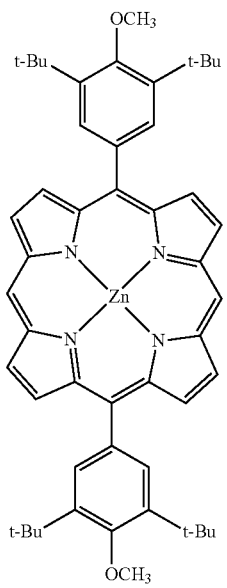

The product (3) (2.6 g, 3.5 mmol) dissolved in CH$_2$Cl$_2$ (750 ml) and zinc acetate hydrate (Zn(OAc)$_2$.2H$_2$O, 7.68 g, 35 mmol) dissolved in MeOH (75 ml, 10 eq) are mixed together. The mixture is stirred under ambient condition for 3 hr, and concentrated with a rotary evaporator. Then, MeOH is added to the residue, and the product (4) (2.8 g, 99%) is obtained after filtration.

10,20-dibromo-5,15-bis(3,5-di-tert-butyl-4-methoxyphenyl) porphyrinato Zinc(II) (5)

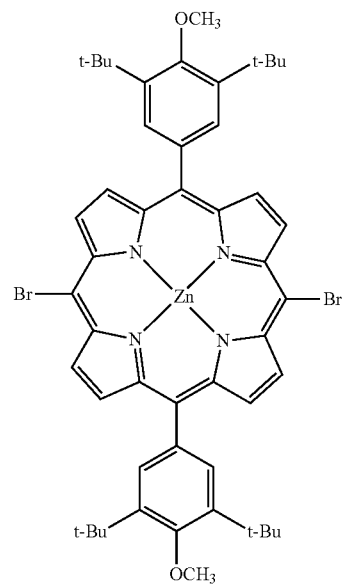

The product (4) is dissolved in CH$_2$Cl$_2$ (750 ml) and pyridine (25 ml). Then, N-bromosuccinimide (NBS, 1.56 g, 8.75 mmol) dissolved in CH$_2$Cl$_2$ (250 ml) is slowly added into the solution under nitrogen. After completion of the reaction, the solution is quenched with acetone (75 ml) and concentrated with a rotary evaporator. After recrystallization with CH$_2$Cl$_2$/MeOH, a purple solid product (5) is obtained (3.09 g, 91%). $^1$H NMR (CDCl$_3$/pyridine-d$_5$, 400 MHz) 9.66 (d, J=4.8 Hz, 2H), 8.92 (d, J=4.4 Hz, 2H), 8.02 (s, 4H), 4.01 (s, 6H), 1.63 (s, 36H).

5,15-bis(3,5-di-tert-butyl-4-methoxyphenyl)-10,20-bis (trimethylsilylethynyl) porphyrinato Zinc (II) (6)

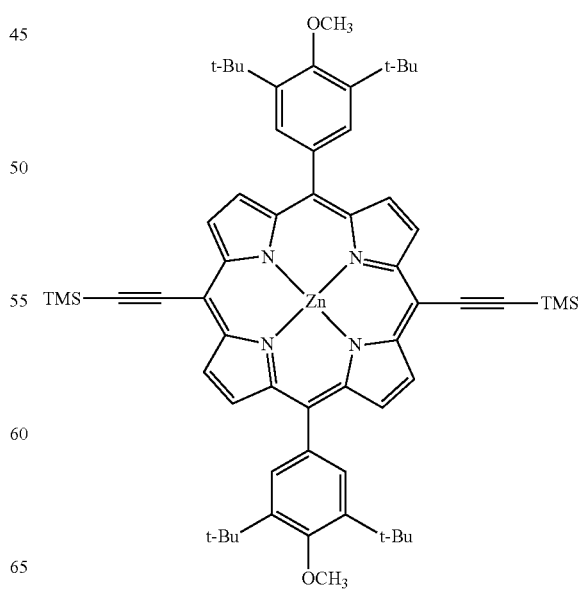

The product (5) (1 g, 1 mmol), bis(triphenylphosphine) palladium(II) dichloride (Pd(PPh$_3$)$_2$Cl$_2$, 70 mg, 0.1 mmol), copper(I) iodide (CuI, 19 mg, 0.1 mmol) and trimethylsilyl acetylene (57 ml, 4 mmol) are dissolved in THF (38 ml) and NEt$_3$ (9 ml) under nitrogen. Then, processes including refluxing for 4 hr, concentrating and purifying by a column chromatography method (using CH$_2$Cl$_2$:hexane=1:5) are performed. After recrystallization with CH$_2$Cl$_2$/MeOH, a purple solid product (6) is obtained (0.7 g, 70%). $^1$H NMR (400 MHz, CDCl$_3$) δ 9.73-9.70 (m, 4H), 8.99 (d, J=4.5 Hz, 4H), 8.09-8.07 (m, 4H), 4.04-4.01 (m, 6H), 1.64 (s, 36H), 0.60 (s, 18H).

5-(4-carboxyphenylethynyl)-15-(4-(N,N-diocty-lamino) phenylethynyl)-10,20-bis(3,5-di-tert-butyl-4-methoxyphenyl) porphyrinato Zinc(II) (7)

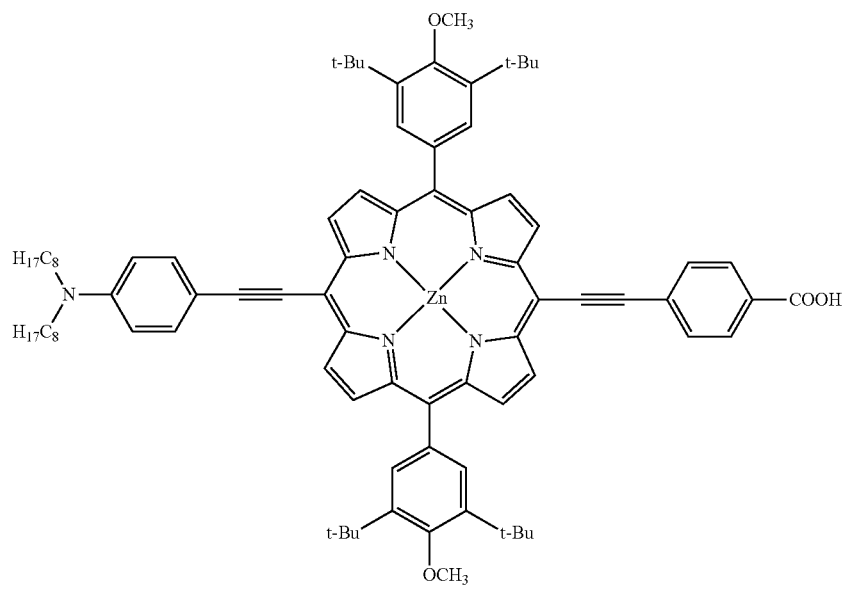

The product (6) (100 mg, 0.085 mmol) is dissolved in THF (3 ml), and tetra-n-butylammonium fluoride (TBAF, 1 M in THF, 0.85 ml, 0.85 mmol) is added into the solution. The solution is stirred for 20 min for reaction, and then concentrated with a rotary evaporator. The residue is extracted with CH$_2$Cl$_2$ and H$_2$O, dried with anhydrous magnesium sulfate (MgSO$_4$) and concentrated to obtain a product (6a) (70 mg, 95%). A mixture of the product (6a), the product (2) (43 mg, 0.098 mmol), 4-iodobenzoic acid (24.1 mg, 0.098 mmol), tri(dibenzylideneacetone) dipalladium (Pd$_2$(dba)$_3$, 22.3 mg, 0.024 mmol) and triphenylarsine (AsPh$_3$, 49.6 mg, 0.162 mmol) is dissolved in THF (10 ml) and NEt$_3$ (2 ml). The mixture is refluxed for 10 hr, concentrated with a rotary evaporator, purified by a column chromatography method (using CH$_2$Cl$_2$:MeOH=20:1). After recrystallization with CH$_2$Cl$_2$/MeOH, a green solid product (7), which is the above-mentioned photosensitive porphyrin-based dye, is obtained (48 mg, 40%). $^1$H NMR (400 MHz, CDCl$_3$) δ 9.68 (dd, J=7.4, 4.5 Hz, 4H), 8.89 (d, J=4.5 Hz, 2H), 8.85 (d, J=4.5 Hz, 2H), 8.26 (s, 2H), 8.05 (s, 2H), 8.02 (s, 4H), 7.82 (d, J=8.6 Hz, 2H), 6.73 (d, J=8.7 Hz, 2H), 3.96 (s, 6H), 3.33 (s, 4H), 3.15 (s, 36H), 1.41-1.10 (m, 24H), 0.86 (t, J=6.8 Hz, 6H).

From the above descriptions, the present disclosure provides a photosensitive porphyrin-based dye and a dye-sensitized solar cell. The dye-sensitized solar cell is cost-effective because the disclosed photosensitive porphyrin-based dye is competitive in less synthesis difficulty. Moreover, the attached units including the electron donor unit(s) D, the electron acceptor unit(s) A and the optional blocker unit(s) P can be adjusted or selected according to different requirements while maintaining high photoelectric conversion efficiency so as to increase the flexibility of the present disclosure.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A dye-sensitized solar cell containing a photosensitive porphyrin-based dye coated on a semiconductor film, the photosensitive porphyrin-based dye having a structural formula (I):

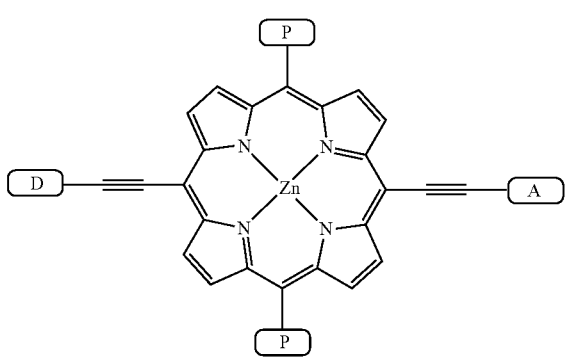

(I)

D representing an electron donor unit selected from a group consisting of:

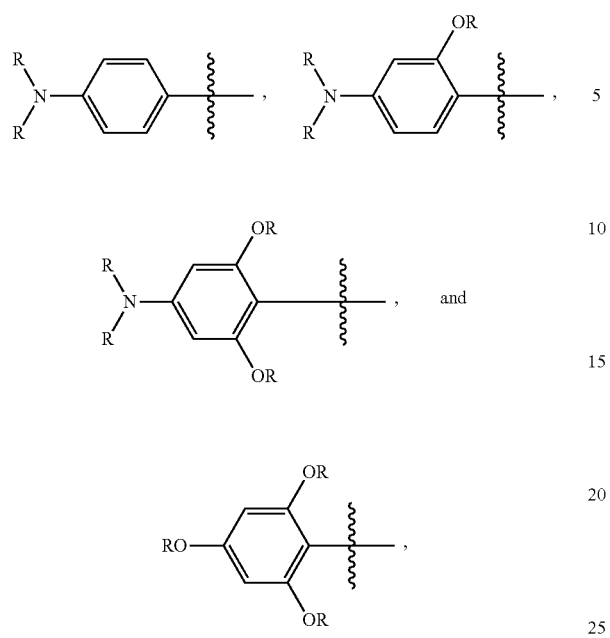
wherein R=C_nH_{2n+1} and n=1 to 12;
A representing an electron acceptor unit selected from a group consisting of:
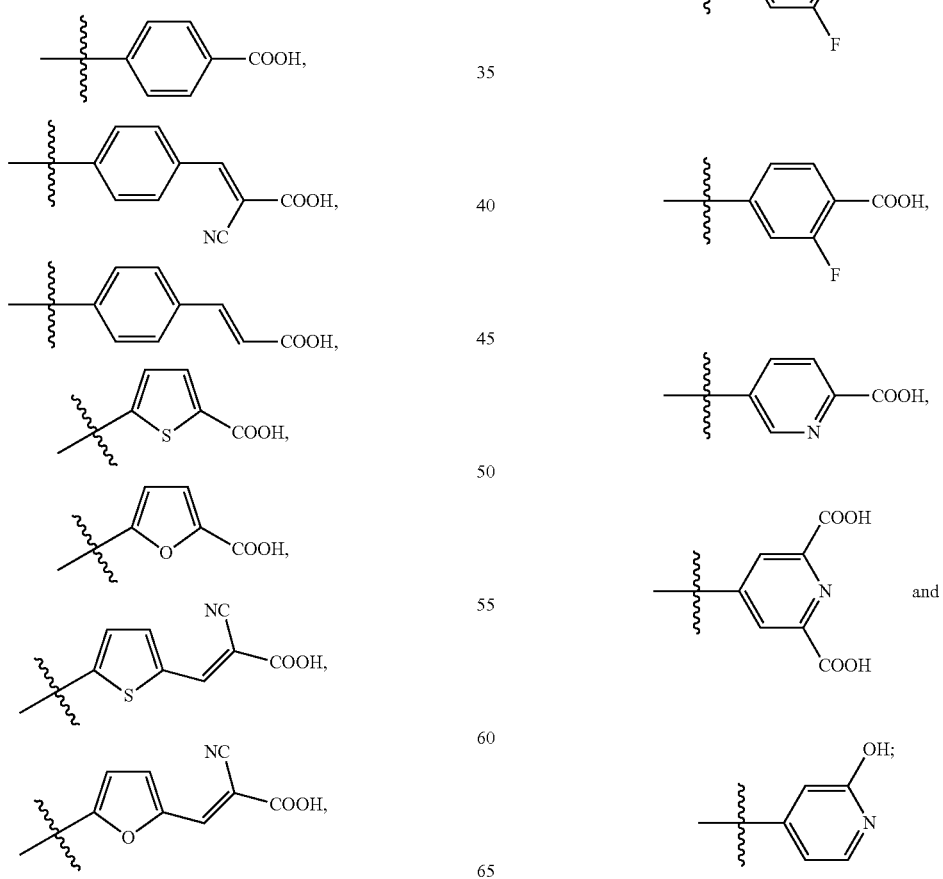

and

P representing a blocker unit selected from a group consisting of:

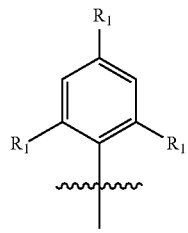

wherein $R_1=C_nH_2F_{2n-1}$, $OC_nH_{2n+1}$ or $OC_nH_2F_{2n-1}$, n=1 to 12, and

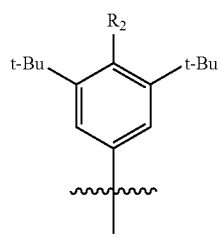

wherein $R_2=C_nH_{2n+1}$, $C_nH_2F_{2n-1}$, $OC_nH_{2n+1}$ or $OC_nH_2F_{2n-1}$, n=1 to 12, two blocker units P in the structural formula (I) being identical or different.

2. The dye-sensitized solar cell according to claim 1, wherein the electron acceptor unit A is selected from a group consisting of:

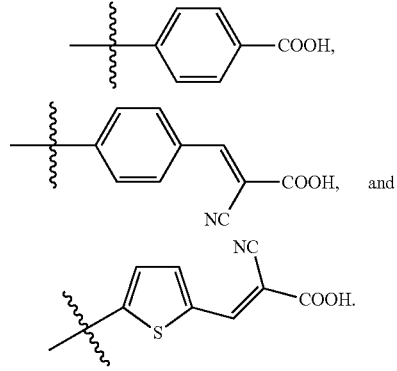

3. The dye-sensitized solar cell according to claim 1, wherein the photosensitive porphyrin-based dye includes 5-(4-carboxyphenylethynyl)-15-(4-(N,N-dioctylamino) phenylethynyl)-10,20-bis(3,5-di-tert-butyl-4-methoxyphenyl) porphyrinato Zinc(II) having a structural formula of:

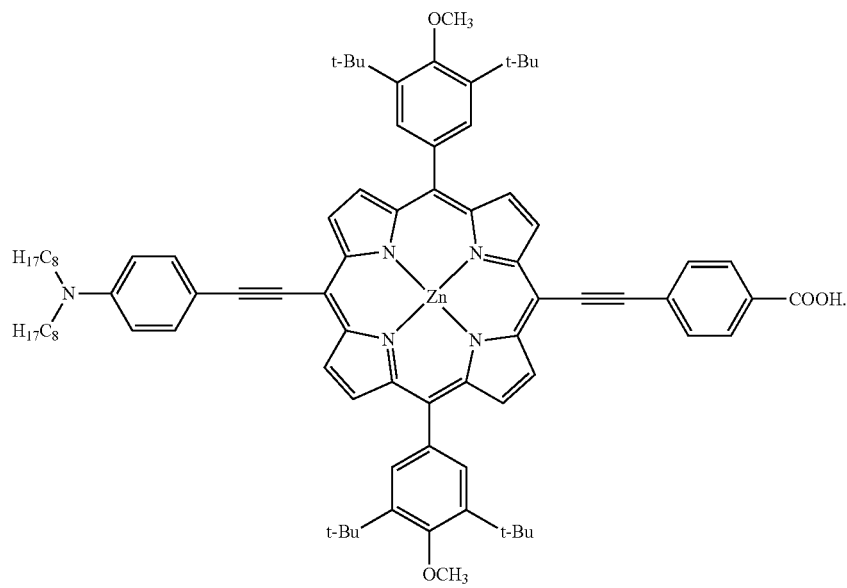

* * * * *